US012094758B2

(12) United States Patent
Hung et al.

(10) Patent No.: US 12,094,758 B2
(45) Date of Patent: Sep. 17, 2024

(54) SEMICONDUCTOR STRUCTURE AND METHOD FOR MANUFACTURING THE SAME

(71) Applicant: UNITED MICROELECTRONICS CORP., Hsinchu (TW)

(72) Inventors: Tien-Tsai Hung, Singapore (SG); Yi Liu, Singapore (SG); Guo-Hai Zhang, Singapore (SG); Ching-Hwa Tey, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 63 days.

(21) Appl. No.: 17/843,089

(22) Filed: Jun. 17, 2022

(65) Prior Publication Data
US 2023/0386893 A1     Nov. 30, 2023

(30) Foreign Application Priority Data

May 25, 2022    (TW) .................................. 111119509

(51) Int. Cl.
*H01L 21/762*     (2006.01)
*H01L 23/00*      (2006.01)
*H01L 27/12*      (2006.01)

(52) U.S. Cl.
CPC ...... *H01L 21/76251* (2013.01); *H01L 23/562* (2013.01); *H01L 23/564* (2013.01); *H01L 27/1203* (2013.01)

(58) Field of Classification Search
CPC ........... H01L 21/76251; H01L 27/1203; H01L 23/3185; H01L 23/3171; H01L 23/3192; H01L 23/3178; H01L 23/562

USPC .......................................... 257/506; 438/207
See application file for complete search history.

(56) References Cited

U.S. PATENT DOCUMENTS

| | | | |
|---|---|---|---|
| 6,913,520 B1 | 7/2005 | Liao | |
| 6,924,236 B2 | 8/2005 | Yano | |
| 7,638,439 B2 | 12/2009 | Kubota | |
| 7,718,542 B2 | 5/2010 | Kim | |
| 7,915,170 B2 | 3/2011 | Ruo Qing | |
| 8,278,189 B2 | 10/2012 | Hsieh | |
| 8,310,065 B2 | 11/2012 | Wu et al. | |
| 8,603,908 B2 | 12/2013 | Fischer | |
| 8,859,398 B2 | 10/2014 | Letz | |
| 9,129,985 B2 | 9/2015 | Tsao et al. | |
| 9,224,696 B2 | 12/2015 | Li et al. | |

(Continued)

*Primary Examiner* — Karen Kusumakar
*Assistant Examiner* — Adam S Bowen
(74) *Attorney, Agent, or Firm* — WPAT, P.C

(57) ABSTRACT

A semiconductor structure is provided. The semiconductor structure includes a wafer structure. The wafer structure has a normal region and a trimmed region adjacent to the normal region. A top surface of the trimmed region is lower than a top surface of the normal region. The semiconductor structure includes a dielectric layer and a conductive layer disposed on the wafer structure in the normal region and the trimmed region. The semiconductor structure includes a protective layer disposed on a portion of the dielectric layer in the trimmed region and a portion of the conductive layer in the trimmed region. The semiconductor structure includes another dielectric layer disposed on a portion of the dielectric layer in the normal region and a portion of the conductive layer in the normal region and on the protective layer.

8 Claims, 7 Drawing Sheets

(56) References Cited

U.S. PATENT DOCUMENTS

| | | |
|---|---|---|
| 10,522,652 B1 | 12/2019 | Su et al. |
| 2001/0051432 A1* | 12/2001 | Yano et al. ......... H01L 21/0287 |
| | | 438/692 |
| 2007/0054490 A1 | 3/2007 | Chen |
| 2014/0273480 A1 | 9/2014 | Previtali |

* cited by examiner

SEMICONDUCTOR STRUCTURE AND METHOD FOR MANUFACTURING THE SAME

This application claims the benefit of Taiwan application Serial No. 111119509, filed May 25, 2022, the subject matter of which is incorporated herein by reference.

TECHNICAL FIELD

This disclosure relates to a semiconductor structure and a method for manufacturing the same. More particularly, the disclosure relates to a semiconductor structure having a trimmed region and a method for manufacturing the same.

BACKGROUND

The trimming process may be conducted in the production for some semiconductor devices, such as in a RF SOI process. However, structures and wafer thicknesses in the trimmed region and the normal region are different. As such, the processes after the trimming process may cause damage in a structure in the trimmed region. Such damage may further lead to pollution of the wafer and/or an ineffective extra work to the trimmed region during subsequent processes.

SUMMARY

This disclosure is focused on the prevention or at least decrease of the damage in the trimmed region and the related disadvantages.

According to some embodiments, a semiconductor structure is provided. The semiconductor structure comprises a wafer structure. The wafer structure has a normal region and a trimmed region adjacent to the normal region. A top surface of the trimmed region is lower than a top surface of the normal region. The semiconductor structure comprises a dielectric layer and a conductive layer disposed on the wafer structure in the normal region and the trimmed region. The semiconductor structure comprises a protective layer disposed on a portion of the dielectric layer in the trimmed region and a portion of the conductive layer in the trimmed region. The semiconductor structure comprises another dielectric layer disposed on a portion of the dielectric layer in the normal region and a portion of the conductive layer in the normal region and on the protective layer.

According to some embodiments, a method for manufacturing a semiconductor structure is provided. The method comprises following steps. A wafer structure is provided. The wafer structure has a normal region and a trimmed region adjacent to the normal region. A top surface of the trimmed region is lower than a top surface of the normal region. A dielectric layer and a conductive layer are formed on the wafer structure in the normal region and the trimmed region. A protective layer is formed on a portion of the dielectric layer in the trimmed region and a portion of the conductive layer in the trimmed region. Another dielectric layer is formed on a portion of the dielectric layer in the normal region and a portion of the conductive layer in the normal region and on the protective layer.

Figure 1A:
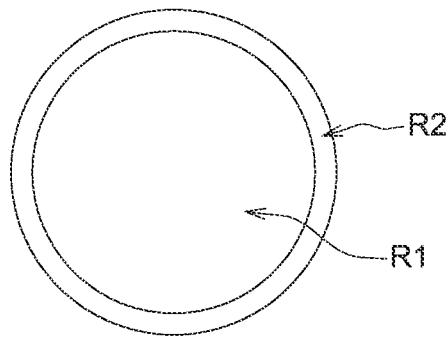
FIGS. 1A-1B show an exemplary semiconductor structure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The description and the drawings are provided for illustrative only, and not intended to result in a limitation. For clarity, the elements may not be drawn to scale. In addition, some elements and/or reference numerals may be omitted from some drawings. When an element is mentioned as being "disposed on" or "coupled to" another element, the element may be directly or indirectly disposed on or coupled to the another element. To the contrary, when an element is mentioned as being "directly disposed on" or "directly coupled to" another element, there is no intervening element between the two elements. It is contemplated that the elements and features of one embodiment can be beneficially incorporated in another embodiment without further recitation.

Figure 1B:
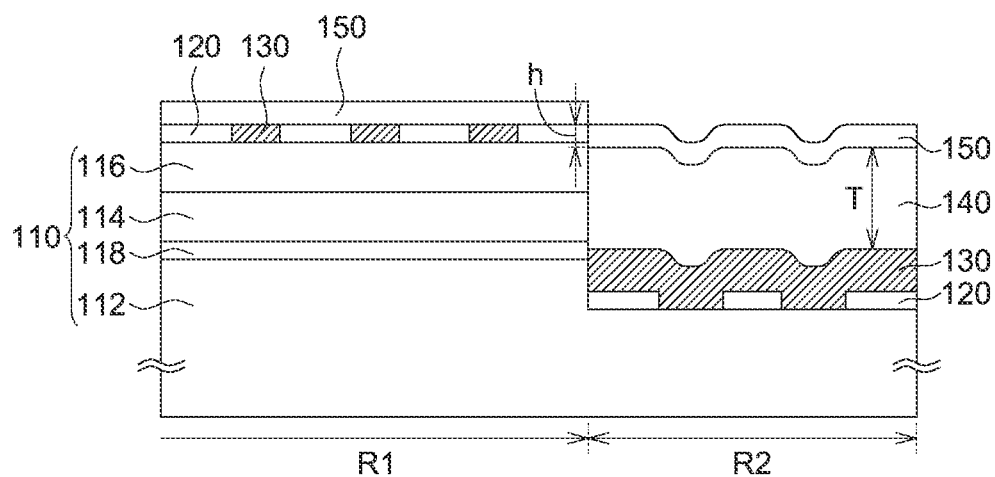

Referring to FIGS. 1A-1B, an exemplary semiconductor structure 100 is shown. The semiconductor structure 100 comprises a wafer structure 110. The wafer structure 110 has a normal region R1 and a trimmed region R2 adjacent to the normal region R1. A top surface of the trimmed region R2 is lower than a top surface of the normal region R1. The semiconductor structure 100 comprises a dielectric layer 120 and a conductive layer 130 disposed on the wafer structure 110 in the normal region R1 and the trimmed region R2. The semiconductor structure 100 comprises a protective layer 140 disposed on a portion of the dielectric layer 120 in the trimmed region R2 and a portion of the conductive layer 130 in the trimmed region R2. The semiconductor structure 100 comprises another dielectric layer 150 disposed on a portion of the dielectric layer 120 in the normal region R1 and a portion of the conductive layer 130 in the normal region R1 and on the protective layer 140.

Specifically, according to some embodiments, the wafer structure 110 may comprise a wafer 112, a device layer 114, and a barrier oxide layer 116. The device layer 114 is disposed on the wafer 112 in the normal region R1. The barrier oxide layer 116 is disposed on the device layer 114. In some embodiments, the wafer structure 110 may further comprise a TEOS layer 118 disposed on the wafer 112 in the normal region R1. In such a condition, the device layer 114 is disposed on the TEOS layer 118.

The dielectric layer 120 and the conductive layer 130 are disposed in both of the normal region R1 and the trimmed region R2. According to some embodiments, the portion of the conductive layer 130 in the normal region R1 and the portion of the dielectric layer 120 in the normal region R1 are disposed in the same level. According to some embodiments, the portion of the conductive layer 130 in the trimmed region R2 is disposed on the portion of the dielectric layer 120 in the trimmed region R2. The dielectric layer 120 may be formed of any suitable interlayer dielectric material. The conductive layer 130 may be formed of metal, but the disclosure is not limited thereto.

The protective layer 140 is disposed only in the trimmed region R2. The protective layer 140 can protect underlying structure and reduce a height difference between the normal region R1 and the trimmed region R2, and thus prevent damage of the underlying structures caused by a following process. According to some embodiments, the protective layer 140 has a thickness T such that a top surface of the protective layer 140 is lower than a top surface of the portion of the dielectric layer 120 in the normal region R1 and the portion of the conductive layer 130 in the normal region R1 by 20 μm or less. In other words, the height difference h between the normal region R1 and the trimmed region R2 is 20 μm or less. The protective layer 140 may be formed of oxide, but the disclosure is not limited thereto.

The dielectric layer 150 is disposed in both of the normal region R1 and the trimmed region R2. Similar to the dielectric layer 120, the dielectric layer 150 may be formed of any suitable interlayer dielectric material.

As shown in FIG. 1A, the trimmed region R2 may surround the normal region R1. In some embodiments, there may be several trimmed regions in the semiconductor structure 100, and at least one of them is configured in a similar manner to the trimmed region R2 and has the protective layer for preventing the structure damage in the trimmed region.

Now the disclosure is directed to a method for manufacturing such a semiconductor structure. The method comprises following steps. A wafer structure is provided. The wafer structure has a normal region and a trimmed region adjacent to the normal region. A top surface of the trimmed region is lower than a top surface of the normal region. A dielectric layer and a conductive layer are formed on the wafer structure in the normal region and the trimmed region. A protective layer is formed on a portion of the dielectric layer in the trimmed region and a portion of the conductive layer in the trimmed region. Another dielectric layer is formed on a portion of the dielectric layer in the normal region and a portion of the conductive layer in the normal region and on the protective layer.

Referring to FIGS. 2A-2L, an exemplary method for manufacturing a semiconductor structure is shown.

Figure 2A:
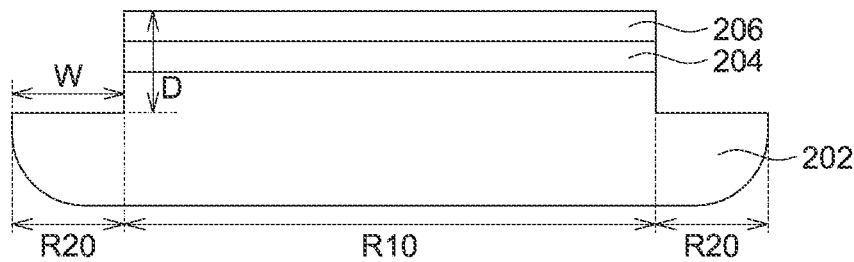
FIGS. 2A-2L show various stages of an exemplary method for manufacturing a semiconductor structure.

In this exemplary method, a device wafer 202 is provided. A barrier oxide layer 204 is formed on the device wafer 202. A device layer 206 is formed on the barrier oxide layer 204. Then, the device wafer structure including the device wafer 202, the barrier oxide layer 204, and the device layer 206 is trimmed to form a structure as shown in FIG. 2A. As such, the device wafer structure has a normal region R10 and a trimmed region R20. The trimmed region R20 is adjacent to the normal region R10. In some embodiments, the trimmed region R20 may surround the normal region R10. For example, the trimmed region R20 may have a width W of 3 mm and a depth D of 150 μm, but the disclosure is not limited thereto.

Figure 2B:
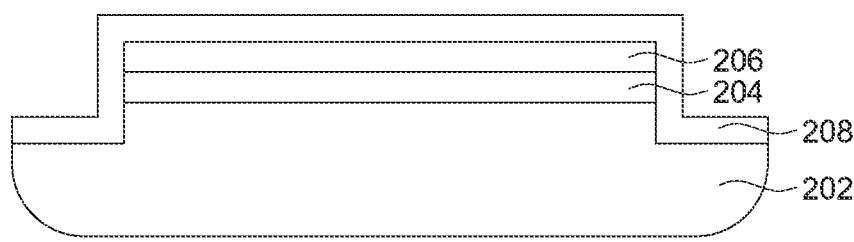
Figure 2C:
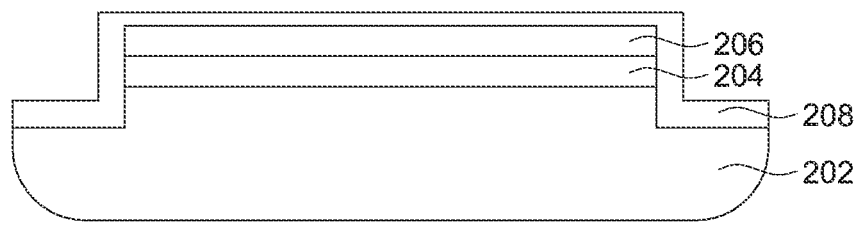

As shown in FIG. 2B, a first TEOS layer 208 is conformally formed on the device wafer 202 with the barrier oxide layer 204 and the device layer 206. In some embodiments, as shown in FIG. 2C, a planarization process may be conducted such that a portion of the first TEOS layer 208 on the device layer 206 is thinned.

Figure 2D:
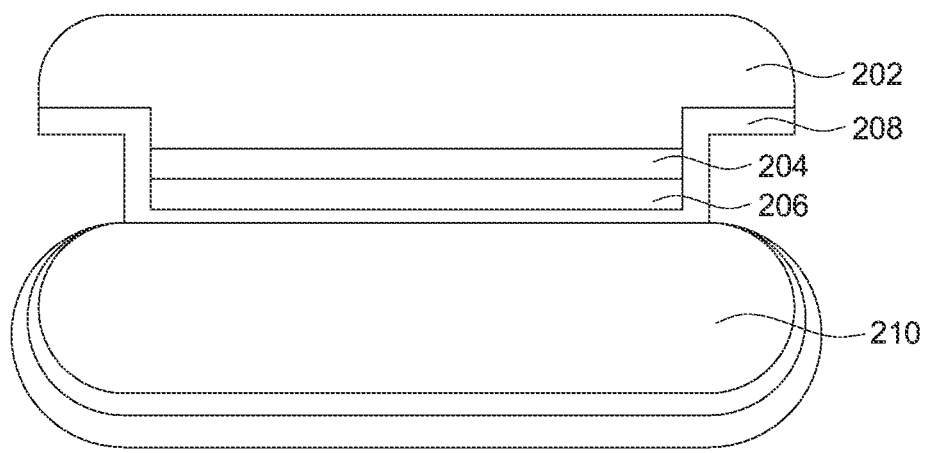

As shown in FIG. 2D, the device wafer 202 with the barrier oxide layer 204 and the device layer 206 is bonded to a handle wafer 210. The device layer 206 faces the handle wafer 210.

Figure 2E:
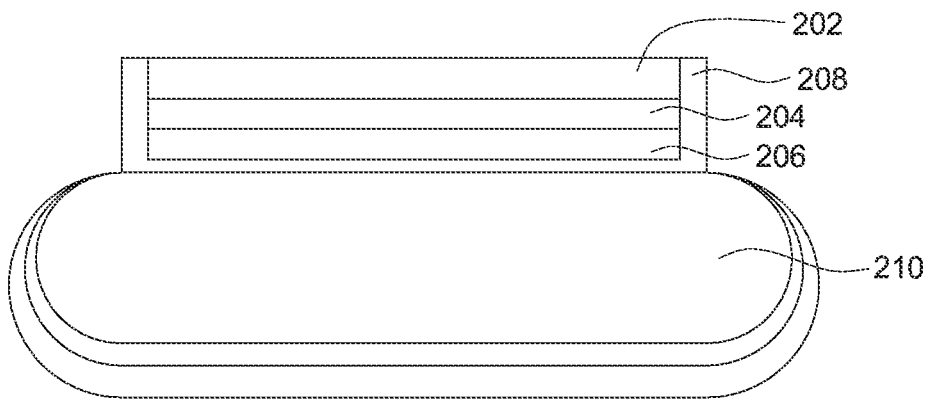

Then, the device wafer 202 can be removed. First, as shown in FIG. 2E, a main body of the device wafer 202 is removed, such as by a planarization process.

Figure 2F:
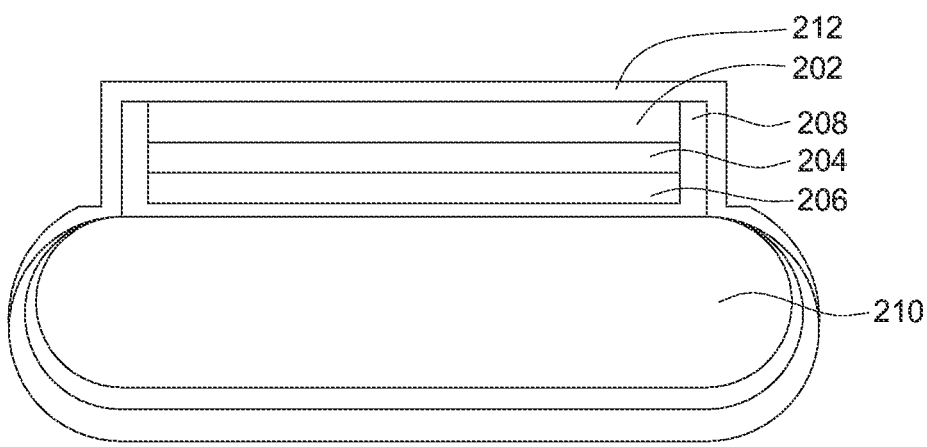

As shown in FIG. 2F, a second TEOS layer 212 is conformally formed on the handle wafer 210 with the first TEOS layer 208, the barrier oxide layer 204 and the device layer 206.

Figure 2G:
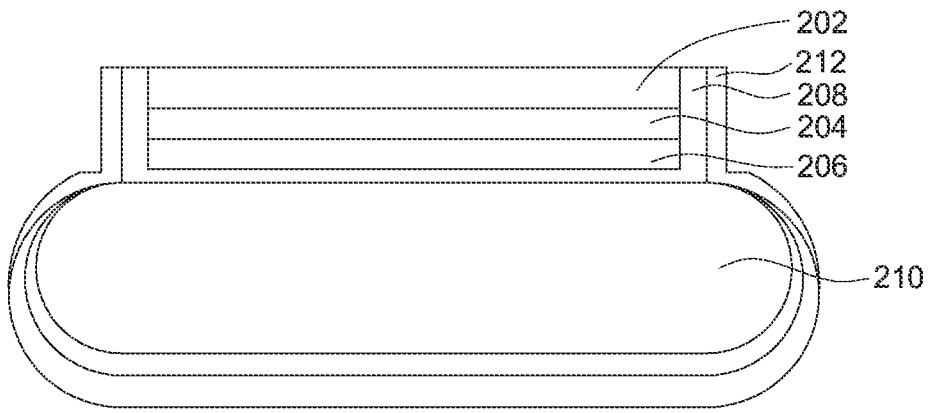

As shown in FIG. 2G, a planarization process may be conducted. As such, a top portion of the second TEOS layer 212 is removed. In some embodiments, some of a remaining portion of the device wafer 202 may also be removed.

Figure 2H:
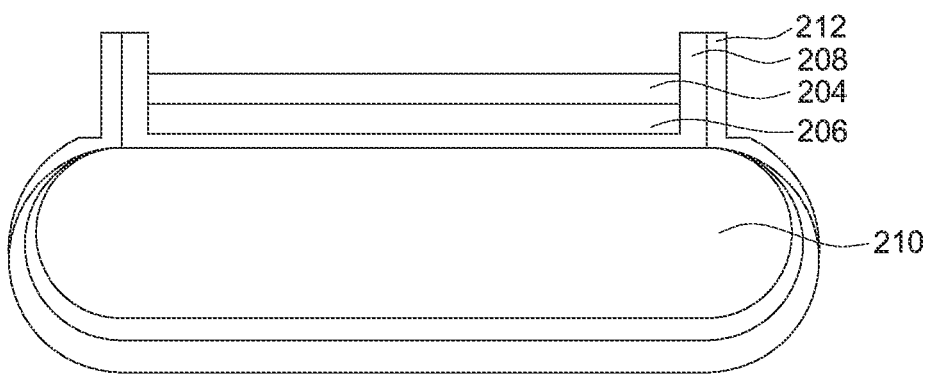

As shown in FIG. 2H, the remaining portion of the device wafer 202 is removed, such as by an etching process using TMAH. As such, the device wafer 202 is completely removed.

Figure 2I:
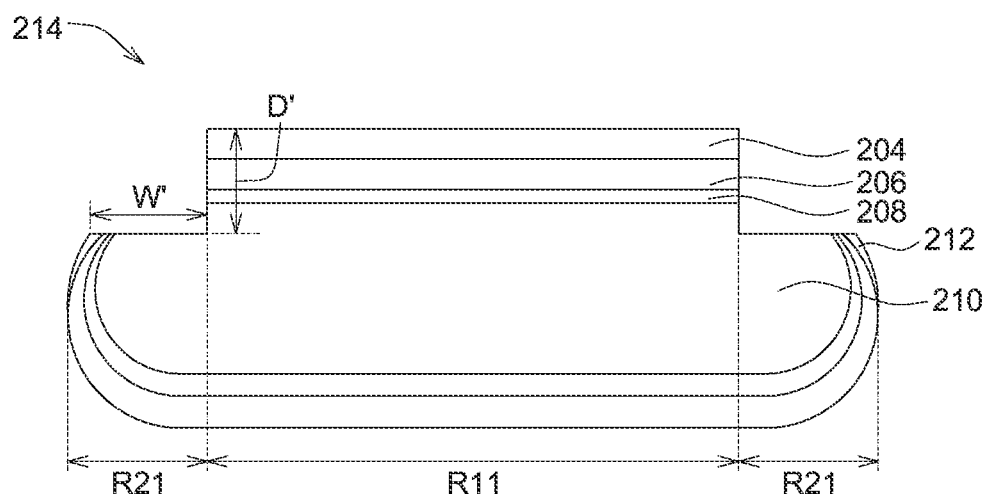

As shown in FIG. 2I, portions of the first TEOS layer 208 and the second TEOS layer 212 on sidewalls of the barrier oxide layer 204 and the device layer 206 are trimmed. After the trimming, a trimmed region R21 may have a width W' of 4.5 mm and a depth D' of 25 μm, but the disclosure is not limited thereto.

As such, a wafer structure 214 having a normal region R11 and a trimmed region R21 adjacent to the normal region R11 is provided, wherein a top surface of the trimmed region R21 is lower than a top surface of the normal region R11.

Figure 2J:
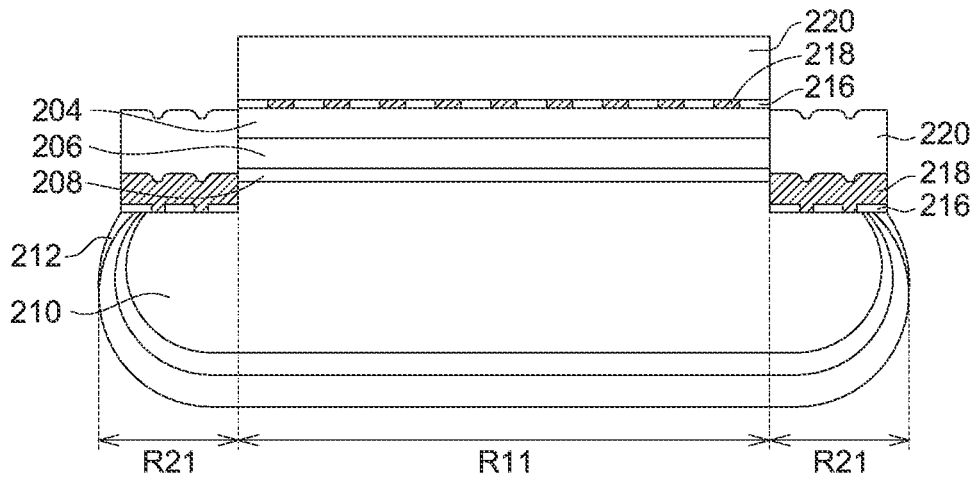

As shown in FIG. 2J, a dielectric layer 216 and a conductive layer 218 are formed on the wafer structure 214 in the normal region R11 and the trimmed region R21. While not particularly illustrated, forming the dielectric layer 216 and the conductive layer 218 may comprises: forming the dielectric layer 216 on the wafer structure 214; forming openings in the dielectric layer 216; forming the conductive layer 218 on the dielectric layer 216 and filling into the openings; and conducting a planarization process to the conductive layer 218 such that a portion of the conductive layer 218 in the normal region R11 is flush with a portion of the dielectric layer 216 in the normal region R11. The dielectric layer 216 may be formed of any suitable interlayer dielectric material. The conductive layer 218 may be formed of metal, but the disclosure is not limited thereto.

Figure 2K:
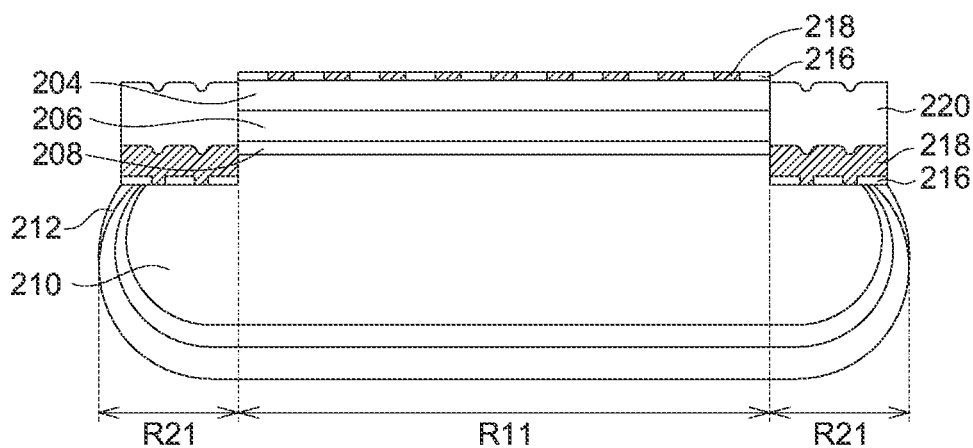

A protective layer 220 is formed on a portion of the dielectric layer 216 in the trimmed region R21 and a portion of the conductive layer 218 in the trimmed region R21. In some embodiments, as shown in FIG. 2J, the protective layer 220 may be firstly formed on the wafer structure 214 in the normal region R11 and the trimmed region R21. Then, as shown in FIG. 2K, a portion of the protective layer 220 in the normal region R11 is removed. The protective layer 220 may be formed of oxide, but the disclosure is not limited thereto. The protective layer 220 may be formed to have a thickness such that a top surface of the protective layer 220 remained in the trimmed region R21 is lower than a top surface of the portion of the dielectric layer 216 in the normal region normal region R11 and the portion of the conductive layer 218 in the normal region R11 by 20 μm or less.

The protective layer 220 covers and thereby protects underlying structure from the stress and/or chemicals in following processes. In addition, if the following processes are conducted without formation of the protective layer 220, since obvious height gap exists between the trimmed region R21 and the normal region R11, the following processes may lead to film crack or metal loss by stress and/or chemicals, in turn resulting in pollution of the wafer and/or an ineffective extra work to the trimmed region during subsequent processes. To the contrary, with the protective layer 220 according to the disclosure, the height gap can be decreased significantly, and thus the damage in the trimmed region and the related disadvantages can be prevented.

Figure 2L:
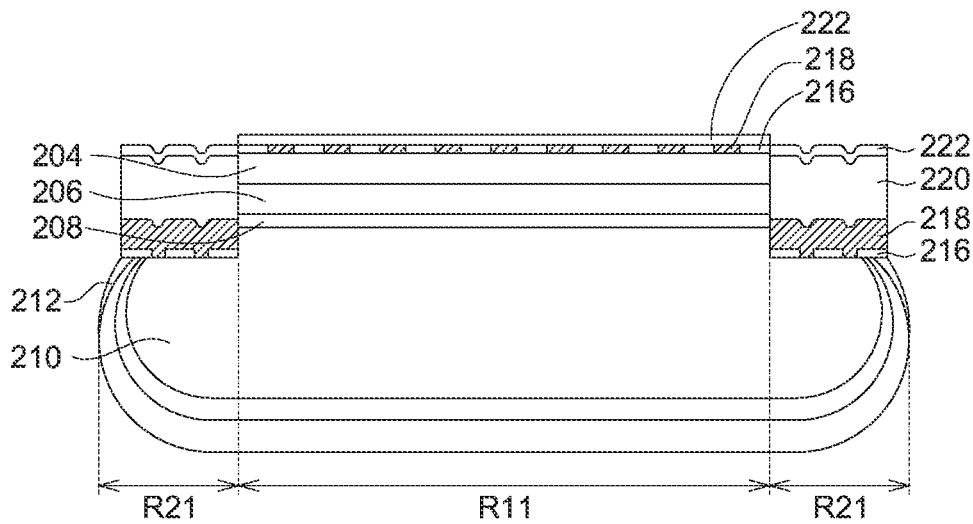

After forming the protective layer 220, any suitable subsequent process can be conducted. For example, as shown in FIG. 2L, another dielectric layer 222 may be formed on the portion of the dielectric layer 216 in the normal region R11 and the portion of the conductive layer 218 in the normal region R11 and on the protective layer 220. The dielectric layer 222 may be formed of any suitable interlayer dielectric material.

In summary, in the semiconductor structure and the method for manufacturing the same according to the disclosure, a protective layer is provided in the trimmed region. The protective layer covers underlying structure and significantly reduces a height difference between the normal region and the trimmed region, and thus the damage in the trimmed region caused during subsequent processes and the related disadvantages can be prevented.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a wafer structure having a normal region and a trimmed region adjacent to the normal region, wherein a top surface of the trimmed region is lower than a top surface of the normal region;
   a dielectric layer and a conductive layer disposed on the wafer structure in the normal region and the trimmed region;
   a protective layer disposed on a portion of the dielectric layer in the trimmed region and a portion of the conductive layer in the trimmed region; and
   another dielectric layer disposed on a portion of the dielectric layer in the normal region and a portion of the conductive layer in the normal region and on the protective layer.

2. The semiconductor structure according to claim 1, wherein the wafer structure comprises:
   a wafer;
   a device layer disposed on the wafer in the normal region; and
   a barrier oxide layer disposed on the device layer.

3. The semiconductor structure according to claim 2, wherein the wafer structure further comprises a TEOS layer disposed on the wafer in the normal region, wherein the device layer is disposed on the TEOS layer.

4. The semiconductor structure according to claim 1, wherein the trimmed region surrounds the normal region.

5. The semiconductor structure according to claim 1, wherein the portion of the conductive layer in the normal region and the portion of the dielectric layer in the normal region are disposed in the same level.

6. The semiconductor structure according to claim 1, wherein the portion of the conductive layer in the trimmed region is disposed on the portion of the dielectric layer in the trimmed region.

7. The semiconductor structure according to claim 1, wherein the protective layer is formed of oxide.

8. The semiconductor structure according to claim 1, wherein the protective layer has a thickness such that a top surface of the protective layer is lower than a top surface of the portion of the dielectric layer in the normal region and the portion of the conductive layer in the normal region by 20 µm or less.

* * * * *